United States Patent [19]

Houryu et al.

[11] Patent Number: 5,557,411
[45] Date of Patent: Sep. 17, 1996

[54] POSITION DETECTION METHOD

[75] Inventors: Sakae Houryu, Hachiohji; Noriyuki Nose, Atsugi, both of Japan

[73] Assignee: Canon Kabushiki Kaisha, Tkyo, Japan

[21] Appl. No.: 577,704

[22] Filed: Dec. 22, 1995

Related U.S. Application Data

[63] Continuation of Ser. No. 266,497, Jun. 27, 1994, abandoned.

[30] Foreign Application Priority Data

Jun. 30, 1993 [JP] Japan ................................. 5-187476

[51] Int. Cl.$^6$ .................................................. G01B 11/00
[52] U.S. Cl. ................................................ 356/401; 250/548
[58] Field of Search ....................................... 356/356, 401, 356/363; 250/548

[56] References Cited

U.S. PATENT DOCUMENTS

| | | |
|---|---|---|
| 5,028,797 | 7/1991 | Abe et al. . |
| 5,142,156 | 8/1992 | Ozawa et al. . |
| 5,148,037 | 9/1992 | Suda et al. . |
| 5,182,615 | 1/1993 | Kurosawa et al. . |
| 5,200,800 | 4/1993 | Suda et al. . |
| 5,313,272 | 5/1994 | Nose et al. . |
| 5,333,050 | 7/1994 | Nose et al. . |
| 5,455,679 | 10/1995 | Houryu et al. ........................... 356/401 |

Primary Examiner—Frank Gonzalez
Assistant Examiner—Robert Kim
Attorney, Agent, or Firm—Fitzpatrick, Cella, Harper & Scinto

[57] ABSTRACT

An interval detection method for detecting the interval between two marks provided on the surface of a wafer with high accuracy using other two marks provided on the wafer, and a method for detecting the relative positions of a wafer and a mask with high accuracy are provided. The method for detecting the interval includes the steps of projecting a first light beam passing through a first mark on the mask and a fifth mark on the wafer onto a predetermined detection surface, projecting a second light beam passing through a second mark on the mask and a sixth mark on the wafer onto the predetermined detection surface, projecting a third light beam passing through a third mark on the mask and the fifth mark onto the predetermined detection surface, projecting a fourth light beam passing through a fourth mark on the mask and the sixth mark onto the predetermined detection surface, and determining the interval between the first mark and the second mark based on information relating to the incident positions of the first, second, third and fourth light beams on the predetermined detection surface, and the interval between the third mark and the fourth mark.

5 Claims, 11 Drawing Sheets

DIRECTION OF ALIGNMENT

|                  | MARK 1 FOR MEASURING MISALIGNMENT | MARK 2 FOR MEASURING MISALIGNMENT | MARKS FOR DETECTING POSITION |
|---|---|---|---|

FIG.10(A) — FIRST MASK: Z8a (with dashed box); Z8b Z6b; Z4 Z2
WAFER: Z8a; Z8b Z6b (Wb); Z4 Z2

FIG.10(B) — SECOND MASK: Z6a (→|←W); (blank); Z3 Z1 (→|←W)
WAFER: Z8a; Z8b Z6b; Z4 Z2

FIG.10(C) — SECOND MASK: Z6a; (blank); Z3 Z1
WAFER: Z8a Z6a (Wa) (→|←W); Z8b Z6b (Wb); Z4 Z2

FIG.10(D) — THIRD MASK: Z7 Z5 (Ma) (→|←X); Z7 Z5 (Ma) (→|←X); Z3 Z1 (→|←X)
WAFER: Z8a Z6a (Wa) (→|←W); Z8b Z6b (Wb); Z4 Z2

|  | MARK FOR MEASURING MISALIGNMENT | MARK FOR DETECTING POSITION |
|---|---|---|
| FIG.14(A) FIRST MASK / WAFER | 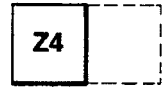  | 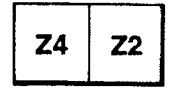 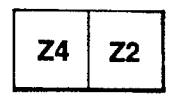 |
| FIG.14(B) SECOND MASK / WAFER | 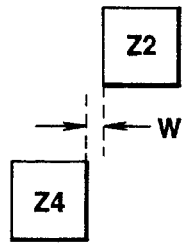 | 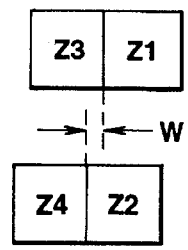 |
| FIG.14(C) SECOND MASK / WAFER | 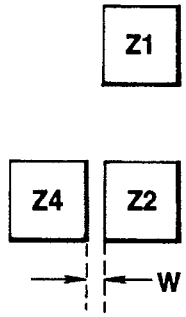 | 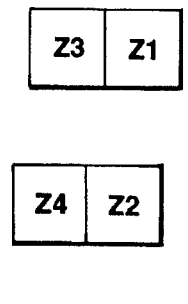 |
| FIG.14(D) THIRD MASK / WAFER | 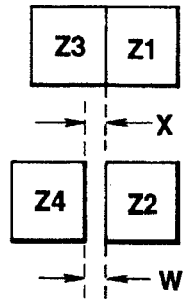 | 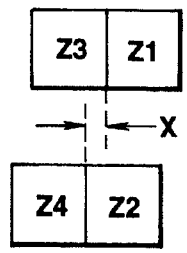 |

POSITION DETECTION METHOD

This application is a continuation of application Ser. No. 08/266,497 filed Jun. 27, 1994, now abandoned.

BACKGROUND OF THE INVENTION

1. Field of the Invention

This invention relates to a misalignment measuring method, in which when an object, such as a mask, is aligned with another object, such as a wafer, and patterns on the object are printed on the other object using, for example, an exposure apparatus for manufacturing semiconductor devices, the accuracy of the alignment is measured. The invention also relates to a position detection apparatus which uses such a method.

2. Description of the Related Art

In a so-called exposure transfer apparatus (an exposure apparatus) for manufacturing semiconductor devices which exposes and transfers a circuit pattern formed on a reticle onto a photosensitive material coated on a wafer using ultraviolet rays, X-rays, or the like, relative alignment between the reticle (a first object) and the wafer (a second object) is an important factor for improving the performance of obtained semiconductor devices. Particularly in alignment in recent exposure apparatuses, for example, an accuracy in alignment of less than a micrometer is required in order to realize high-integration semiconductor devices.

In many alignment apparatuses, so-called alignment patterns are provided on the surfaces of a reticle and a wafer, and the wafer is aligned with the reticle utilizing information relating to the positions of the alignment patterns. Conventionally, in order to actually measure and evaluate the alignment performance of an apparatus provided as an exposure apparatus, two fine patterns formed on a reticle are aligned with and printed on a wafer, and the amount of deviation between the two patterns on the wafer is obtained by performing visual measurement, image processing, or the like.

When measuring the amount of deviation between patterns on a wafer in such an alignment apparatus, for example, the following problems arise in visual measurement.

(1) Accuracy in the measurement is unstable, because the measurement greatly depends on the experience and skill of a person who performs the visual measurement.

(2) Time and much manual effort are needed because of non-automatic measurement.

(3) High accuracy in the measurement cannot obtained.

Also in measurement performed by image processing, problems arise in that, for example, time is needed because the processing is complicated, and high accuracy in the measurement cannot be obtained.

SUMMARY OF THE INVENTION

The present invention has been made in consideration of the above-described problems.

It is an object of the present invention to provide a method for measuring deviation between patterns on a wafer caused by inferior alignment accuracy of an apparatus, in which misalignment can be automatically measured to shorten the time for measurement, and stable high accuracy in measurement can be obtained, and to provide a position detection method which uses this method.

According to one aspect, the present invention, which achieves the above-described object, relates to a position detection method for measuring an interval between a first mark and a second mark on a first object, comprising the steps of providing a third mark, having the same optical function as the fist mark, and a fourth mark, having the same optical function as the second mark, on the first object with a predetermined interval therebetween, providing a fifth mark, and a sixth mark, having the same optical function as the fifth mark, on a second object, projecting light onto the first and second objects, projecting a first light beam passing through the first mark and the fifth mark onto a predetermined detection surface, and projecting a second light beam passing through the second mark and the sixth mark onto the predetermined detection surface, projecting a third light beam passing through the third mark and the fifth mark onto the predetermined detection surface, and projecting a fourth light beam passing through the fourth mark and the sixth mark onto the predetermined detection surface, and determining the interval between the first mark and the second mark based on information relating to the incident positions of the first, second, third and fourth light beams on the predetermined detection surface, and the interval between the third mark and the fourth mark.

In one embodiment, each of the marks comprises a physical optical element.

In another embodiment, the incident positions of the first, second, third and fourth light beams on the predetermined detection surface differ from each other.

According to another aspect, the present invention relates to a position detection method for measuring the relative positional relationship between a first object and a second object, comprising the steps of providing a first mark and a second mark on the first object with a predetermined interval therebetween, detecting the positions of the first and second marks relative to the second object by a position detection apparatus, and determining the relationship between the actual relative positions of the first object and the second object, and a result of the detection of the position detection apparatus, based on the predetermined interval and a result of detection of the positions of the first and second marks.

In one embodiment, the method further comprises the steps of providing a third mark, and a fourth mark, having the same optical function as the third mark, on the second object, projecting light onto the first and second objects, projecting a first light beam passing through the first mark and the third mark onto a predetermined detection surface, and projecting a second light beam passing through the second mark and the fourth mark onto the predetermined detection surface, and detecting the incident positions of the first and second light beams on the predetermined detection surface.

The foregoing and other object, advantages and features of the present invention will become more apparent from the following detailed description of the preferred embodiment taken in conjunction with the accompanying drawings.

BRIEF DESCRIPTION OF THE DRAWINGS

FIGS. 10(A) through 10(D) are schematic diagrams illustrating the procedure of replacing the amount of misalignment by the amount of deviation between marks;

FIGS. 14(A) through 14(D) are schematic diagrams illustrating the procedure of replacing the amount of misalignment by the amount of deviation between marks.

DETAILED DESCRIPTION OF THE PREFERRED EMBODIMENT

Figure 1:
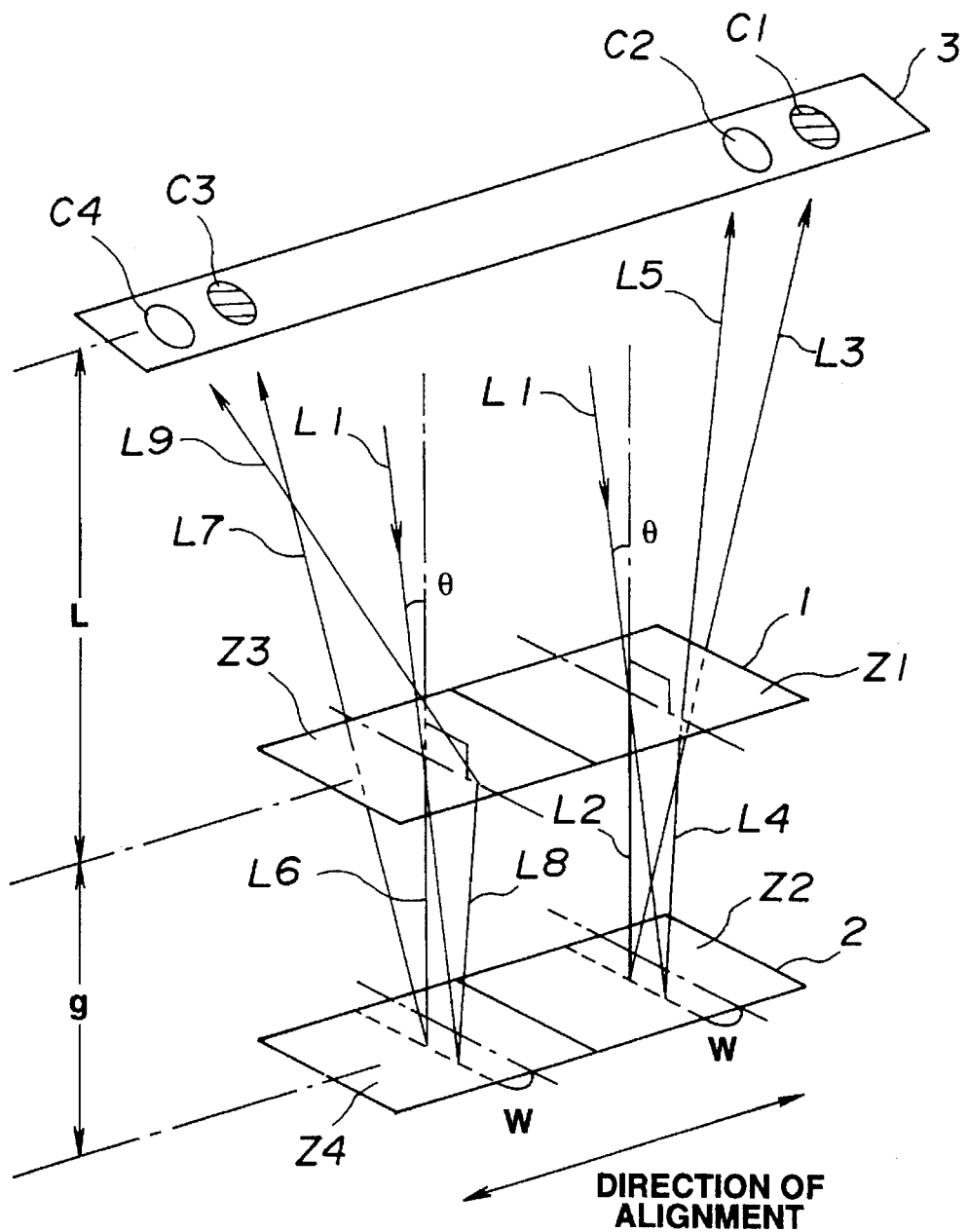
FIG. 1 is a schematic diagram illustrating the configuration of a principal portion of an alignment optical system of a position detection apparatus according to an embodiment of the present invention.
Figure 2:
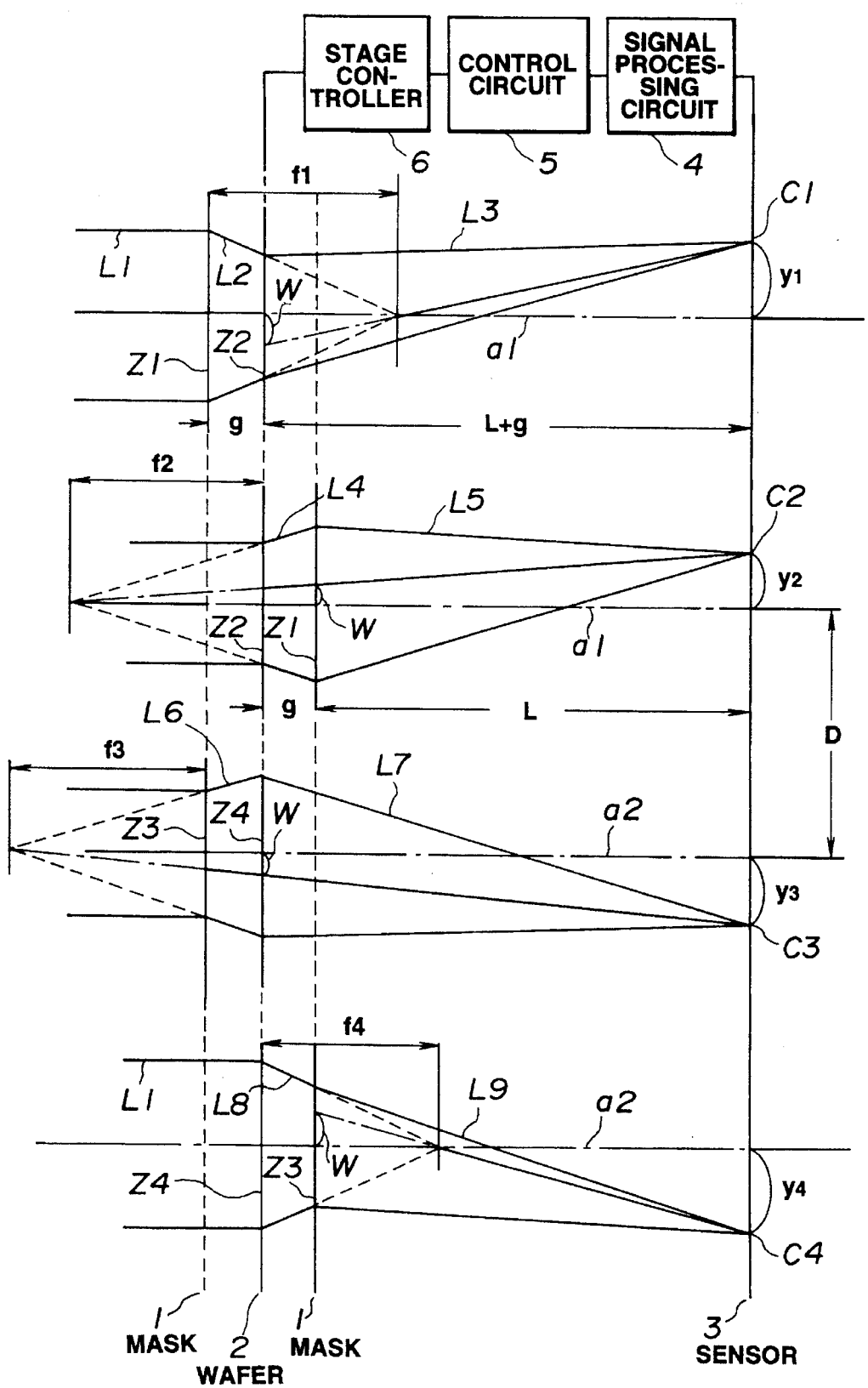
FIG. 2 is a diagram illustrating optical paths shown in FIG. 1.

First, a description will be provided of a position detection apparatus which utilizes a misalignment measuring method according to the present invention. FIG. 1 is a schematic diagram illustrating the configuration of a principal portion of a position detection apparatus according to an embodiment of the present invention. FIG. 2 is a diagram obtained by schematically developing the optical paths of respective light beams shown in FIG. 1.

In FIGS. 1 and 2, L1 represents a light beam from a semiconductor laser, an SLD (superluminescent diode), an X-ray source, or the like (not shown). The light beam L1 is incident upon a first physical optical element Z1 and a third physical optical element Z3 (both transparent) provided on the surface of a first object 1, such as a mask or the like, at an angle θ with respect to a line normal to the surface of the first object 1. A second object 2, such as a wafer or the like, is disposed so as to face the first object 1 with an interval g. W represents the amount of misalignment between the first object 1 and the second object 2. A second physical optical element Z2 and a fourth physical optical element Z4 (both reflective, but shown as transparent in FIG. 2) are provided on the surface of the second object 2. Each of these physical optical elements Z1–Z4 comprises, for example, a diffraction grating, a zone plate, or the like.

Figure 3:
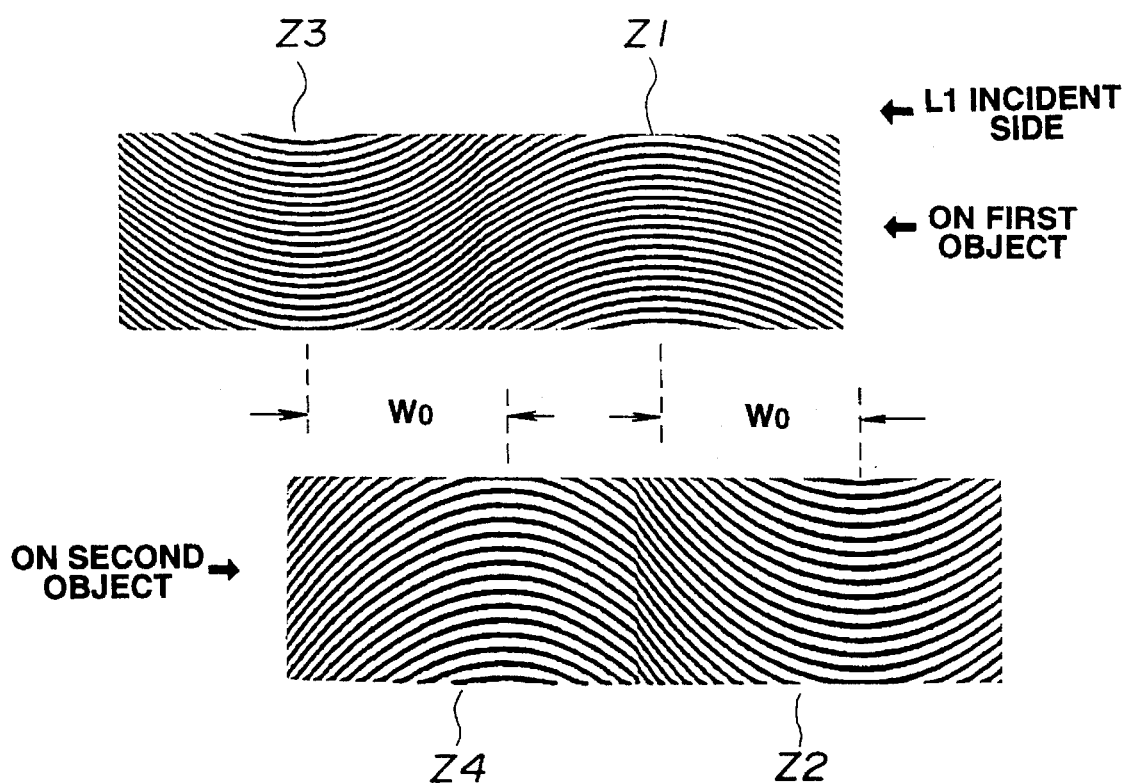
FIG. 3 is a diagram illustrating marks provided on a mask and a wafer shown in FIG. 1.

FIG. 3 illustrates an example of the patterns of the physical optical elements (Z1–Z4) on the first object and the second object in the present embodiment.

The physical optical elements Z1–Z4 have a lens function, and have focal lengths of f1–f4, respectively.

Referring again to FIG. 2, each of L2–L9 represents a diffracted light beam of a predetermined order from the corresponding one of the physical optical elements Z1–Z4. A sensor 3, serving as detection means, such as a line sensor, an area sensor or the like, is disposed at a position separated from the first object 1 by a distance L. Symbols a1 and a2 represent the optical axes of the physical optical elements Z1 and Z3, respectively, and the optical axis a1 and the optical axis a2 are separated by a distance D.

Points C1–C4 correspond to the positions of the centers of gravity of light beams on the surface of the sensor 3 of the diffracted light beams L3, L5, L7 and L9, respectively. The points C1 and C2 are situated at positions separated from the optical axis a1 by distances y1 and y2, respectively, and the points C3 and C4 are situated at positions separated from the optical axis a2 by distances y3 and y4, respectively.

The position of the center of gravity of a light beam indicates a position where when values obtained by multiplying position vectors from respective points within a cross section of the light beam by the amounts of light at the corresponding points are integrated within the entire cross-sectional surface, the integrated value equaling a 0 vector.

A signal processing circuit 4 serves as calculation means, and obtains the positions of the centers of gravity of the light beams L3, L5, L7 and L9 based on information from the sensor 3.

In the present embodiment, the relationship between the amount of misalignment W produced when the interval between the first object 1 and the second object 2 equals g, and information y relating to the incident position of diffracted light of a predetermined order on the surface of the sensor 3 is experimentally obtained for various cases, and a general expression is formed. The obtained general expression is recorded, for example, in recording means provided in a part of calculation means of the signal processing circuit 4, or recording means provided outside of the device (not shown). Using distances y1–y4, and D serving as positional information, and the general expression recorded in the recording means, the amount of misalignment W between the first object 1 and the second object 2, and the interval g are obtained.

A control circuit 5 controls the amount of misalignment W between the first object 1 and the second object 2, and the interval g in accordance with information relating to the amount of misalignment W and the interval g from the signal processing circuit 4. A stage controller 6 drives a stage (not shown), which mounts the second object 2, in accordance with an instruction from the control circuit 5.

In the present embodiment, the light beam L1 from the light source is incident upon the physical optical elements Z1 and Z3 on the surface of the first object 1. A first-order diffracted light beam L2 generated from the light beam L1 by the physical optical element Z1 is incident upon the physical optical element Z2, where a first-order diffracted light beam L3 is produced, whose diffraction direction differs in accordance with the amount of misalignment W. The diffracted light beam L3 passes through the physical optical element Z1 without being diffracted as a 0-order diffracted light beam, and is imaged onto the surface of the sensor 3 at a position separated from the optical axis a1 on the surface of the sensor 3 by a distance y1. Since the distance between the sensor 3 and the first object 1 has a constant value L, the value of the distance y1 depends on the interval g and the amount of misalignment W.

The light beam L1 passing through the physical optical element Z1 without being diffracted as a 0-order diffracted light beam is incident upon the physical optical element Z2. A first-order diffracted light beam L4 subjected to first-order diffraction by the physical optical element Z2 is incident again upon the physical optical element Z1, where a first-order diffracted light beam L5, whose diffraction direction differs in accordance with the amount of misalignment W, is generated. The first-order diffracted light beam L5 is imaged onto the surface of the sensor 3 at a position separated from the optical axis a1 by a distance y2.

Diffracted light beams L6–L9 are generated from the light beam L1 incident upon the physical optical element Z3 in the same manner as in the case of the light beam incident upon the physical optical element Z1. The diffracted light beams L7 and L9 are imaged onto the surface of the sensor 3 at positions separated by distances y3 and y4, respectively, from the optical axis a2 on the surface of the sensor 3. The signal processing circuit 4 obtains the positions C1, C2, C3 and C4 of the centers of gravity of the light beams L3, L5, L7 and L9, respectively, from information read from the sensor 3, and calculates the interval D14 between the points C1 and C4, and the interval D23 between the points C2 and C3. Utilizing the relationship of respective expressions, which will be described later, the amount of misalignment W and the interval g between the first object 1 and the second object 2 are obtained from the values of the intervals D14 and D23.

The control circuit 5 moves the second object 2 to a predetermined position to align the first object 1 and the second object 2 by driving the stage controller 6 in accordance with information relating to the amount of misalignment W and the interval g from the signal processing circuit 4.

In the present embodiment, diffracted light is not limited to first-order diffracted light, but the same effects may be obtained by using diffracted light having an order equal to or higher than the second order.

Figure 4:
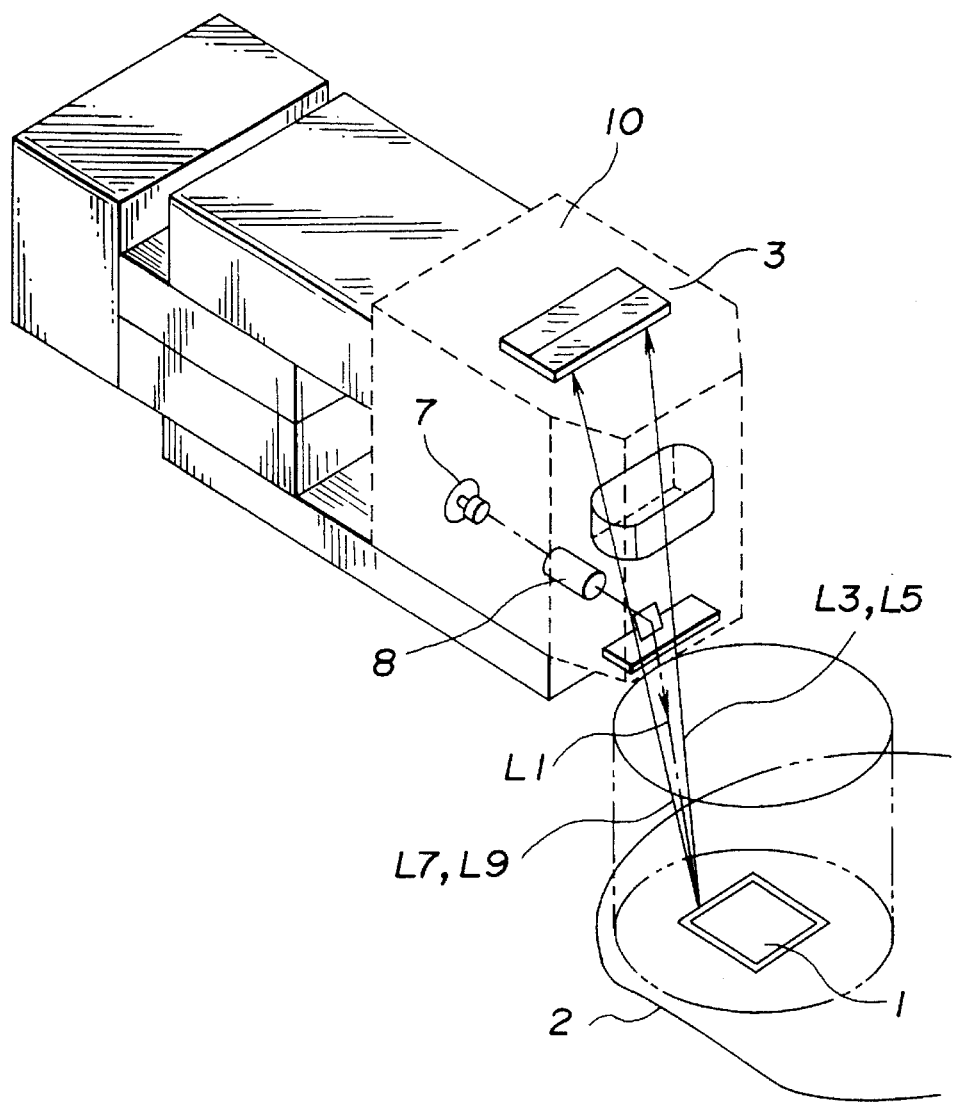
FIG. 4 is a schematic diagram illustrating the configuration of a principal portion of a pickup head of the position detection apparatus shown in FIG. 1, the mask and the wafer.

In the present embodiment, as shown in FIG. 4, a light source 7, a lens 8, and the sensor 3 can be integrated at a small confined location in an optical pickup head 10. Hence, the present embodiment has features in that, for example, the size of an optical probe can be reduced, and the optical probe need not be moved during exposure, whereby the throughput of the apparatus increases.

Next, a description will be provided of a method for obtaining the amount of misalignment W and the interval g between the first object 1 and the second object 2 in the present embodiment with reference to FIG. 2.

In FIG. 2, in a lens system for generating the diffracted light beam L3, the light beam L1 passes through the physical optical elements Z1 and Z2 having a lens function, and is incident upon the point C1. At that time, the distance y1 up to the position C1 representing the center of gravity of the diffracted light beam L3 is determined by the amount of misalignment W and the interval g between the first object 1 and the second object 2, and is generally expressed by:

$$y1=F1(W,g) \quad (1).$$

Similarly, in three other lens systems, the distances y1, y2, y3 and y4 are determined by the amount of misalignment W and the interval g, and are expressed by:

$$y2=F2(W,g) \quad (2),$$

$$y3=F3(W,g) \quad (3),$$

$$y4=F4(W,g) \quad (4).$$

When the distances y1–y4 are expressed in the above-described manner, amounts Y1 and Y2, which depend on the amount of misalignment W and the interval g, can be expressed in the following manner using the interval D13 between the points C1 and C3, and the interval D24 between the points C2 and C4:

$$Y1=y1+y3=D13-D=F1+F3=F5(W,g),$$

$$Y2=y2+y4=D24-D=F2+F4=F6(W,g).$$

That is, $$Y1=F5(W,g) \quad (5),$$

$$Y2=F6(W,g) \quad (6).$$

In general, when two unknowns are present, the unknowns can be determined if two expressions including the unknowns are present.

That is, if the following two expressions can be provided:

$$A=G1(W,g) \quad (7),$$

$$B=G2(W,g) \quad (8),$$

the values of the two unknowns W and g can be obtained by obtaining the quantities of A and B by performing measurement, or the like.

The above-described expression (1) can be expressed, for example, in terms of paraxial geometrical optics using W and g as follows.

From FIG. 2, $$y1 \cdot W = L + 2g - f1 \cdot f1 - g,$$

from which we obtain:

$$y1=(L+g)/(f1-g)-1) \cdot W \quad (9).$$

Similarly, the other expressions (2), (3) and (4) can also be expressed as follows:

$$y2=(L/(f2+g)+1) \cdot W \quad (10),$$

$$y3=((L+g)/(f3+g)+1) \cdot W \quad (11),$$

$$y4=(L/(f4-g)-1) \cdot W \quad (12).$$

Using the above-described expressions, the expressions (5) and (6) can be expressed as follows:

$$D13-D=((L+g)/(f1-g)+(L+g)/(f3+g)) \cdot W \quad (13),$$

$$D24-D=(L/(f2+g)+L/(f4-g)) \cdot W \quad (14).$$

In the expressions (13) and (14), D is the interval between the optical axes a1 and a2, which is already known, and the values of the intervals D13 and D24 can be measured. Hence, the values of the amount of misalignment W and the interval G can be obtained from the expressions (13) and (14). By eliminating the amount of misalignment W from the expressions (13) and (14), a cubic equation for the interval g can be obtained, and the values of the amount of misalignment W and the interval g can be easily obtained from this cubic equation using a personal computer, or the like.

The above-described expressions (9)–(12) hold within the range of accuracy which can be provided in paraxial geometric optics. However, when accuracy in alignment is close to about 0.01 μm, the above-described expressions do not always hold due to aberration in the detection system, errors produced when lenses are processed, errors produced at adjustment during assembly, variations in the oscillation wavelength, or the movement of the light-emitting point of the semiconductor laser or the SLD during the lapse of time, and the like.

In the present embodiment, in order to deal with such error factors, the relationship between the amount of alignment W at the interval g, and the distance y of the incident position of the light beam on the surface of the sensor is obtained for various cases, whereby general expressions corresponding to the above-described expressions (1)–(4) are obtained and recorded in the recording means. In actual position detection, the general expressions recorded in the recording means are used.

Furthermore, by updating the obtained general expressions at every predetermined time period, error factors generated during the lapse of time are removed.

In the present embodiment, for example, the interval g, the amount of misalignment W and the distance y are expressed by the following general expression using six coefficients A, B, E, F, I and J:

$$y=(Ag+B)W^2+(Eg+F)W+(Ig+J) \qquad (15).$$

At least six pieces of data are obtained for each light beam to determine the coefficients A, G, E, F, I and J.

In obtaining such data, a tool, with which the amount of misalignment W and the interval g between the first object and the second object have been exactly measured, is provided. The distance from an arbitrary point on the surface of the sensor may be used as the value of the distance y, because the exact distance between light beams can be obtained by obtaining the sum and the difference, such as y1+y2, and the like.

The values of the interval g and the amount of misalignment W are obtained in the following manner.

Suppose that the following expressions corresponding to the above-described expressions (5) and (6) are obtained:

$$\begin{cases} y1 = (A_1g + B_1)W^2 + (E_1g + F_1)W + (I_1g + J_1), & (16) \\ y2 = (A_2g + B_2)W^2 + (E_2g + F_2)W + (I_2g + J_2). & (17) \end{cases}$$

By rewriting these expressions with respect to g, the following expressions are obtained:

$$\begin{cases} y1 = (A_1W^2 + E_1W + I_1)g + (B_1W^2 + F_1W + J_1), & (18) \\ y2 = (A_2W^2 + E_2W + I_2)g + (B_2W^2 + F_2W + J_2). & (19) \end{cases}$$

The value of the amount of misalignment W is obtained from the quadratic equations in the expressions (18) and (19), and the value of the interval g is obtained from this value.

Figure 5:
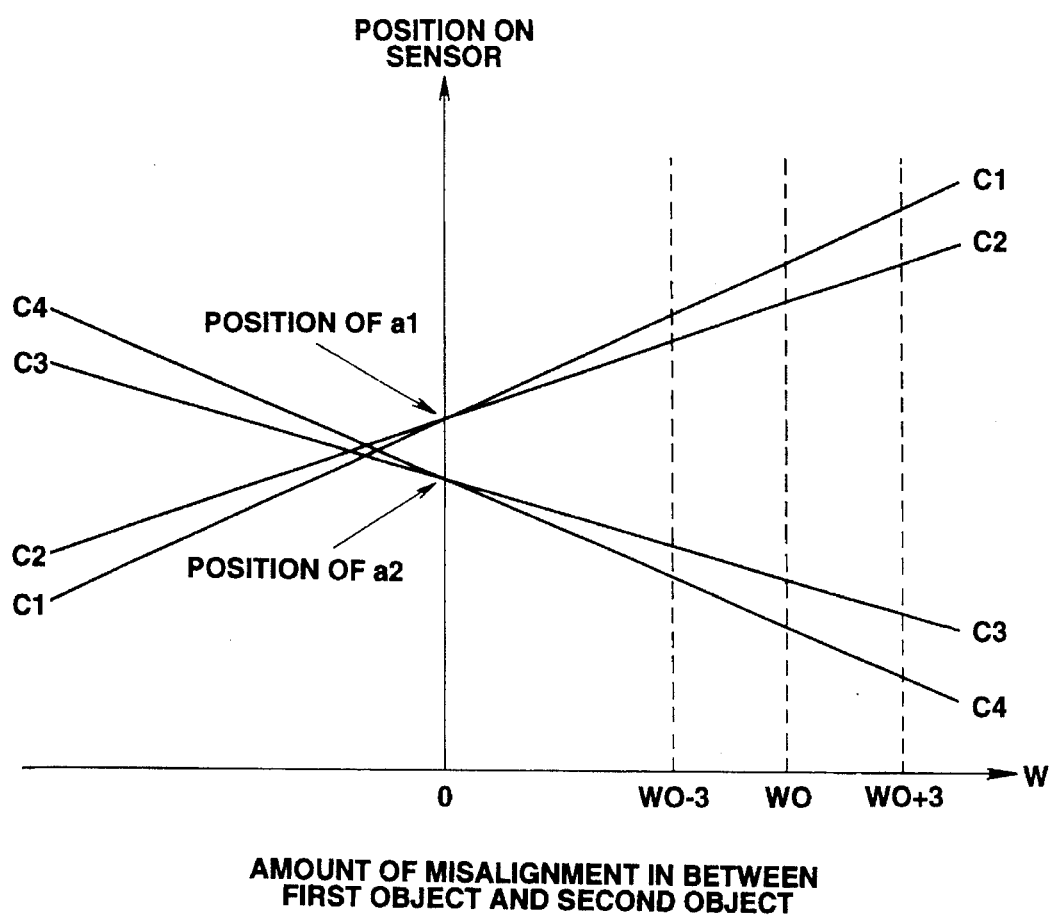
FIG. 5 is a diagram illustrating the relationship between the amount of misalignment between the mask and the wafer, and the positions of incident light beams on a sensor in the present embodiment.

FIG. 5 is a diagram illustrating the manner of change of the centers of gravity C1, C2, C3 and C4 of the diffracted light beams L3, L5, L7 and L9, respectively, on the surface of the sensor 3 in accordance with the amount of misalignment W in the present embodiment. The diffracted light beams L3, L5, L7 and L9 have a certain width on the surface of the sensor 3. Accordingly, if overlapped portions are present, it becomes difficult to obtain the points C1–C4 with high accuracy.

In the present embodiment, if it is desired to measure the amount of misalignment W, for example, within a range of ±3 µm, characteristics of the range of each light beam (for example, the interval between points $W_{0-3}$ and $W_{0+3}$ shown in FIG. 5) are obtained in advance using simulation, or the like, and are utilized.

That is, in the present embodiment, the positions of the centers of gravity of the first and second diffracted light beams produced on a predetermined surface via the first and second physical optical elements, and the positions of the centers of gravity of the third and fourth diffracted light beams produced on the predetermined surface via the third and fourth physical optical elements are detected in a state of being separated by at least the width of each diffracted light beam.

In the present embodiment, by shifting the optical axis a1 of a physical optical element (for example, Z1) on the first object and the optical axis a2 of a physical optical element (for example, Z2) on the second object by a distance $W_0$ when the amount of misalignment W between the first and second objects equals zero, the points C1 and C2, and the points C3 and C4 can be in a separated state when the amount of misalignment between the first object and the second object equals zero.

The arrangement of the patterns of the first through fourth physical optical elements Z1–Z4 shown in FIG. 3 illustrate such a state. In FIG. 3, when the amount of misalignment W between the first and second objects equals zero, the optical axes of the first and second physical optical elements Z1 and Z2, and the optical axes of the third and fourth physical optical elements Z3 and Z4 are set to be shifted from each other by the distance $W_0$.

Accordingly, when these patterns are used, and when the first object and the second object are misaligned by a distance WX, calculation may be performed by replacing the amount of misalignment W in the expressions (9)–(12) by $$W=W_0+WX.$$

In the present embodiment, the same effects may be obtained by providing four physical optical elements on the surface of one of the first and second objects instead of providing two physical optical elements on the surface of each of the first and second objects, and obtaining four diffracted light beams corresponding to the above-described diffracted light beams L3, L5, L7 and L9.

The approach of providing two physical optical elements as in the present embodiment is superior to the approach of providing four physical optical elements in that it requires a smaller area and the amount of diffracted light is doubled in the same area.

Next, a description will be provided of the method for measuring the amount of misalignment according to the present invention with reference to the position detection apparatus shown in FIGS. 1 and 4.

FIGS. 6 through 9 are diagrams illustrating physical optical elements (hereinafter sometimes termed "marks") Z5–Z8 used in the present embodiment.

Figure 8:
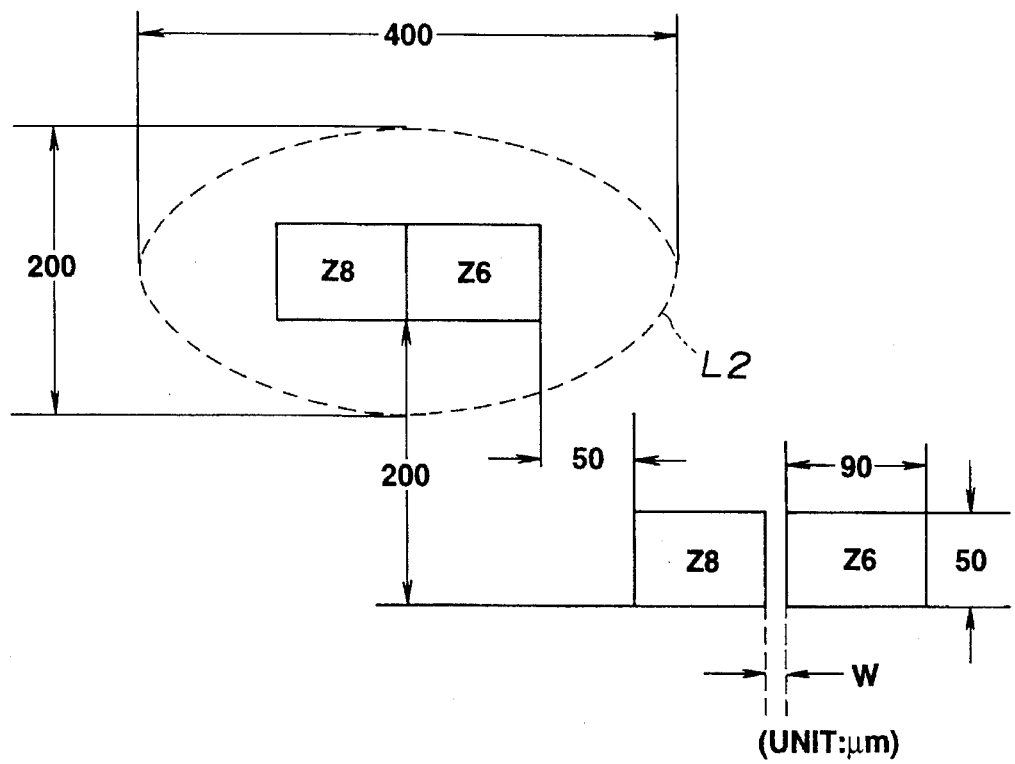
Figure 9:
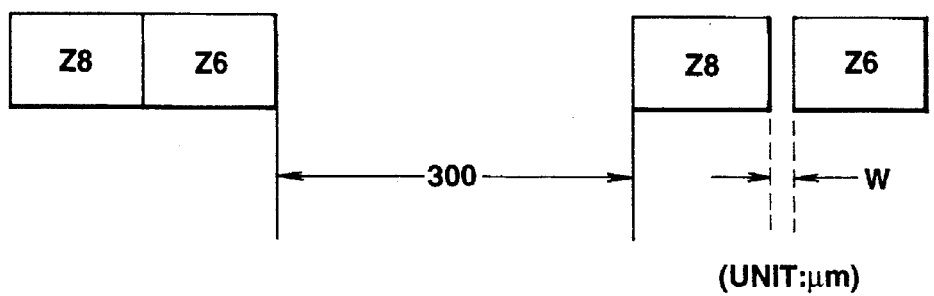

The marks Z8 and Z7 are provided on the surface of the mask 1, and the marks Z6 and Z8 are provided on the surface of the wafer 2. A mark group shown in FIG. 6 will hereinafter be termed a mark group "a", and a mark group shown in FIG. 7 will be hereinafter termed a mark group "b". The amount of misalignment W to be measured between the mask 1 and the wafer 2 is represented by separating the mark Z6 and the mark Z8 shown in FIG. 7 by the distance W. The lens function of the combinations of the marks Z5 and Z6, and the marks Z7 and Z8 is entirely the same as that of the combinations of the marks Z1 and Z2, and the marks Z3 and Z4 shown in FIG. 1. However, the marks Z5 and Z6, and the marks Z7 and Z8 are separated to the right and the left in order to prevent overlap of light beams on the sensor 3. The variable X shown in FIGS. 8 and 7 represents this lateral misalignment or deviation between the boundary of the Z8 and Z7 marks and the boundary of the Z6 and Z8 marks. The approximate size and the positional relationship of the marks of the mark groups "a" and "b" on the wafer 1 are, for example, as shown in FIG. 8 or 9.

In FIG. 8, the major and minor diameters of the light beam L2 at the mark group "a", is 400 µm and 200 µm, respectively.

The distance between the mark Z6 in one pair of marks Z6 and Z8, and the mark Z8 in another pair of marks Z6 and Z8 is 50 μm. The length and width of the mark Z6 is 90 μm and 50 μm, respectively. The distance from one end of a pair of marks Z6 and Z8 to a corresponding end of the other pair of marks Z5 and Z8 is 200 μm. In FIG. 9, the distance between the two pairs of marks Z6 and Z8 is 300 μm.

In the above-described configuration, the light beam L1 is projected onto the mark group "a" and the Y value (Y1) corresponding to the incident position on the sensor is measured. At that time, as shown in FIG. 8, the diffracted light beam L2 is projected onto the marks Z8 and Z8 as, indicated by the broken line.

Thereafter, the light beam L1 is projected onto the mark group "b" by moving the optical pickup head 10, and the Y value (Y2) corresponding to the incident position on the sensor is measured. At that time, by arranging the marks as shown in FIG. 8, it is possible to prevent the side lobe of the light beam L1 from being projected onto other marks.

The variation ΔY of the Y value caused by the amount of misalignment W is expressed by $$\Delta Y = Y1 - Y2.$$

If the magnification of the lens system of the marks Z5 and Z6, or the marks Z7 and Z8 of the mark groups "a" or b is represented by M, $$W = \Delta Y / M.$$

The following factors are present as main factors for generating errors when obtaining the variation ΔY: a deviation between marks due to misalignment between the mask 1 and the wafer 2 (hereinafter termed "M/W deviation"), a deviation in positional relationship between marks and the optical pickup head 10 from a predetermined value (hereinafter termed "M/P deviation"), and a variation in the gap between the mask 1 and the wafer 2 from a predetermined value (hereinafter termed "G variation").

Next, a description will be provided of the influence of the above-described error factors when calculating the variation ΔY.

In FIG. 1, if the light beams L3 and L5, and the light beams L7 and L9 overlap on the sensor 3, the amount of illumination of each light beam changes due to M/P deviation, whereby the position of the center of gravity of the overlapped light beam changes, the Y value changes, and errors are thereby produced. In the present embodiment, however, since respective light beams are separated from each other on the sensor 3, the Y value does not change due to M/P deviation unless the value of the deviation is large, and therefore errors are not produced.

Furthermore, since respective marks are provided on the same mask and wafer, the mark groups "a" and "b" are configured entirely by the same marks, the influence of the M/W deviation and the G variation are entirely the same for the two groups, and are therefore cancelled when calculating the variation ΔY. Accordingly, the value of the variation ΔY is not influenced by the above-described main error factors.

Next, a description will be provided of the influence of the M/P deviation, the M/W deviation and the G variation when the wafer is exchanged.

M/P deviation does not cause errors for the same reason for a first wafer and a second wafer exchanged for the first wafer. The values of M/W deviation and G variation, produced when the first wafer is removed, and the second wafer is moved under the mask and is aligned with the mask, usually differ from the values in the case of the first wafer.

Figure 6:
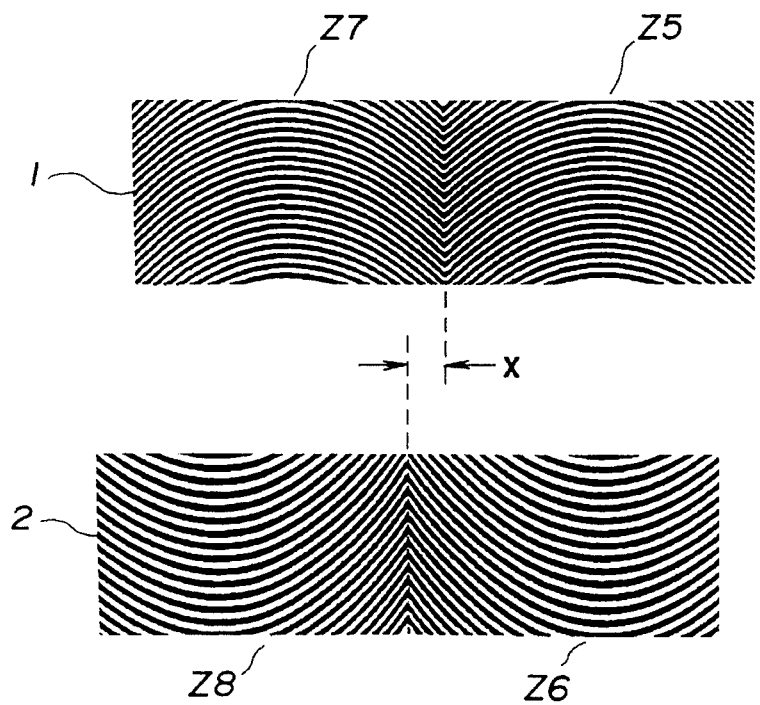
FIGS. 6 through 9 are diagrams illustrating marks for detecting the amount of misalignment in the present embodiment.
Figure 7:
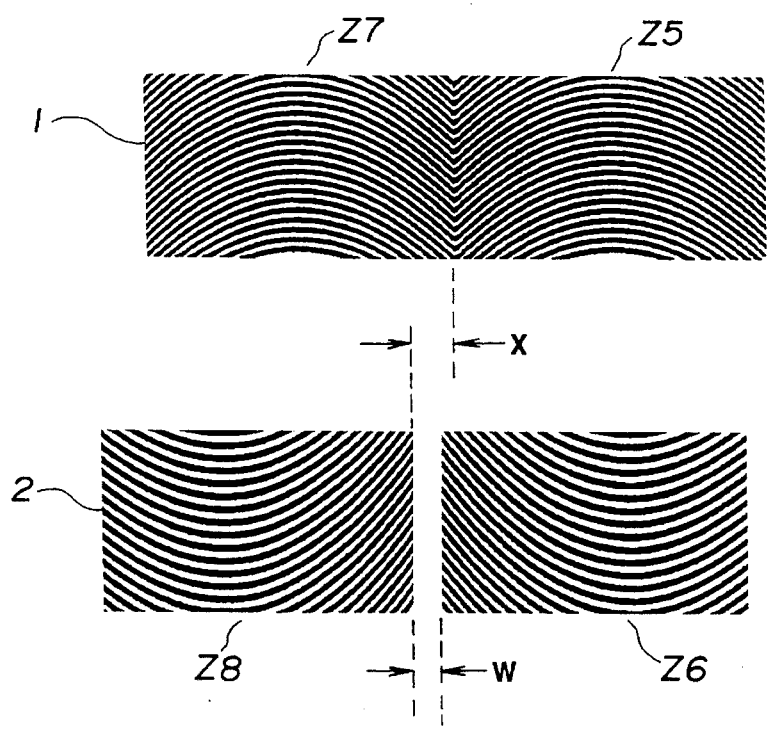

If it is assumed that entirely the same marks as those shown in FIG. 6 and 7 are provided on the wafer 2, the Y value of each mark group, of course, differs from that in the case of the first wafer. However, since respective marks are provided on the same mask and wafer as in the case of the first wafer, the influence of the M/W deviation and the G variation are entirely the same for the mark groups "a" and "b", and are therefore cancelled when calculating the variation ΔY of marks on the second wafer (hereinafter termed a variation ΔY2).

As described above, the influence of the M/W deviation and the G variation produced when exchanging the wafer are cancelled when calculating the variation ΔY caused by the amount of misalignment W. Hence, it is possible to measure the value of the variation ΔY with a small error. The influence of yawing, rolling, pitching or the like of the wafer are also cancelled when calculating the variation ΔY because of the above-described reasons. Accordingly, if the amount of misalignment to be measured between a mask and a wafer can be replaced by the amount of deviation between marks, the amount of misalignment W can be obtained.

FIGS. 10(A) through 10(D) illustrate a procedure of replacing the amount of misalignment between a mask and a wafer by the amount of deviation between marks.

In FIG. 10(A), marks Z8a, Z8b and Z6b on a first mask are printed onto the wafer. Marks Z2 and Z4 on the wafer are used for position detection, as are marks Z2 and Z4 on the first mask. The marks Z6b and Z8b on the wafer constitute a mark Wb for measuring misalignment which corresponds to a value of 0 of the amount of misalignment between the first mask and the wafer 2. The mark Z8a on the wafer 2 is a mark which corresponds to the amount of misalignment W between the first mask and the wafer 2 (to be described later).

FIG. 10(B) illustrates a state in which the amount of misalignment W is produced as a result of alignment between a second mask and the wafer 2 after exchanging the second mask for the first mask or moving the wafer 2 under marks provided on the second mask. The amount of misalignment W is an amount to be measured. A mark Z6a for representing the amount of misalignment W is provided on the second mask. In this embodiment the second mask also has marks Z1 and Z3 used for position detection while the wafer 2 has the same marks as the wafer shown in FIG. 10(A).

FIG. 10(C) illustrates a state in which the mark Z6a on the second mask is printed onto the surface of the wafer 2. The marks Z8a and Z6a on the wafer constitute a mark Wa, and the marks Z8b and Z6b constitute a mark Wb. At this time, marks Z1 and Z3 on the second mask for position detection are not printed on the wafer. In this stage, marks for measuring misalignment and position detection are prepared on the wafer 2.

FIG. 10(D) illustrates a state in which, in order to measure misalignment, the wafer 2 is aligned with a third mask after exchanging the third mask for the second mask or moving the wafer 2. The amount of deviation X at this time may have no relation to the amount of misalignment W to be measured and therefore alignment may be arbitrarily performed. In this embodiment the third mask includes mark Ma, comprising marks Z5 and Z7, and marks Z1 and Z3 for position detection. The wafer includes mark Wa, comprising marks Z6b and Z8b, and marks Z2 and Z4 for position detection. Marks Ma and Wb shown in FIG. 10(D) correspond to the marks shown in FIG. 6, and marks Ma and Wa shown in FIG. 10(D) correspond to the marks shown in FIG. 7.

By performing measurement in the above-described manner, for example, when ΔY=0.3 μm, and M=300; very precise measurement of an amount of misalignment of 0.3/300=0.0001 (μm) can be effected.

When the amount of misalignment W can be obtained in the above-described manner, the coefficients A, B, E, F, I and J of the expression (15) can be obtained using a position detection apparatus only, by preparing a tool which is simpler than the above-described tool for exactly measuring the amount of misalignment W and the gap g between the mask and the wafer.

Figure 11:
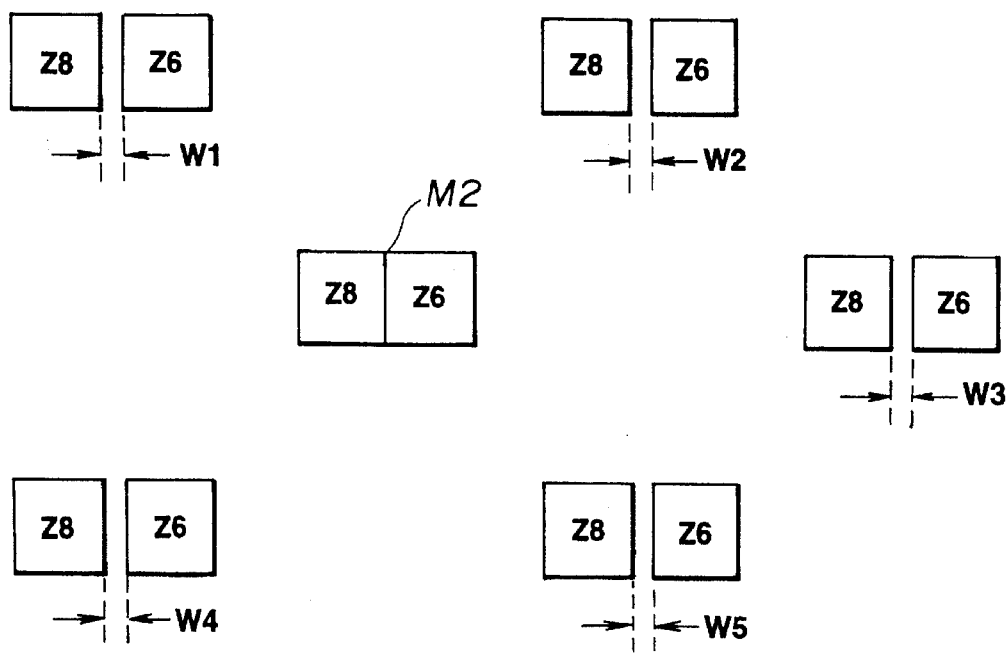
FIG. 11 is a schematic diagram illustrating the arrangement of marks on a wafer in the present embodiment.
Figure 12:
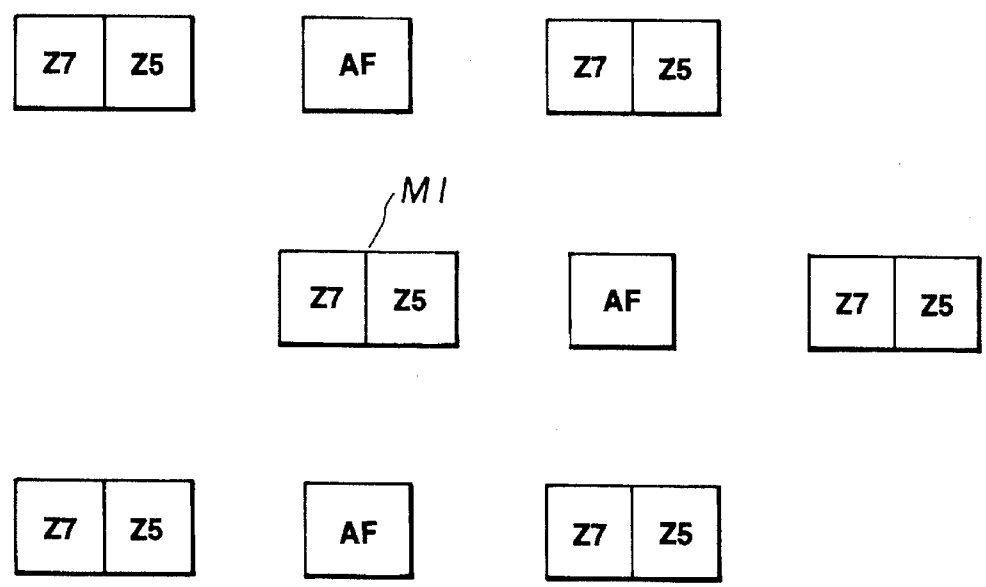
FIG. 12 is a schematic diagram illustrating the arrangement of marks on a mask in the present embodiment.

That is, as shown in FIG. 11, a wafer, on which combinations of marks Z6 and Z8, called mark M2, having various amounts of misalignment W1–W5 corresponding to W shown in expression (15) are provided, is prepared, and as shown in FIG. 12, a mask, on which combinations of marks Z5 and Z7, called mark M1, facing the marks Z6 and Z8, respectively, and marks AF for gap measurement are provided, is prepared.

The wafer is appropriately aligned with the mask using marks M1 and M2 having a value 0 of the amount of misalignment W, and respective Y value are measured. If the Y value having a value of 0 of the amount of misalignment W is represented by $Y_0$, and the Y value having a value $W_n$ (W1–W5) of the amount of misalignment W is represented by $Y_n$, the Y value for each amount of misalignment $W_n$ ($\Delta Y_n$) is obtained as $$\Delta Y_n = Y_n - Y_0.$$

The interval g is measured, for example, by a method disclosed in Japanese Patent Laid-open Application (Kokai) No. 2-167413 (1990). Variation $\Delta Y_n$ for each value of the interval g is also obtained.

When the values of the variation $\Delta Y_n$ and the interval g have been obtained in the above-described manner, since the value of the amount of misalignment $W_n$ is already known, by substituting the values $\Delta Y_n$=y, and $W_n$=W in the expression (15), and preparing at least six expressions, the coefficients A, B, E, F, I and J can be obtained. The expression (15) is quadratic with respect to the amount of misalignment W, and linear with respect to the interval g. Even if the expression includes higher-order terms and the number of coefficients thereby increases, the value of the coefficients can be obtained in a manner similar to the above-described manner.

As described above, since coefficients can be obtained using only an ordinary mask, wafer and position detection apparatus, a particular tool as the above-described one becomes unnecessary, and the coefficients can be easily updated periodically against variations in the values of the expression (15) due to a change in the position detection apparatus as result of the lapse of time.

Figure 13:
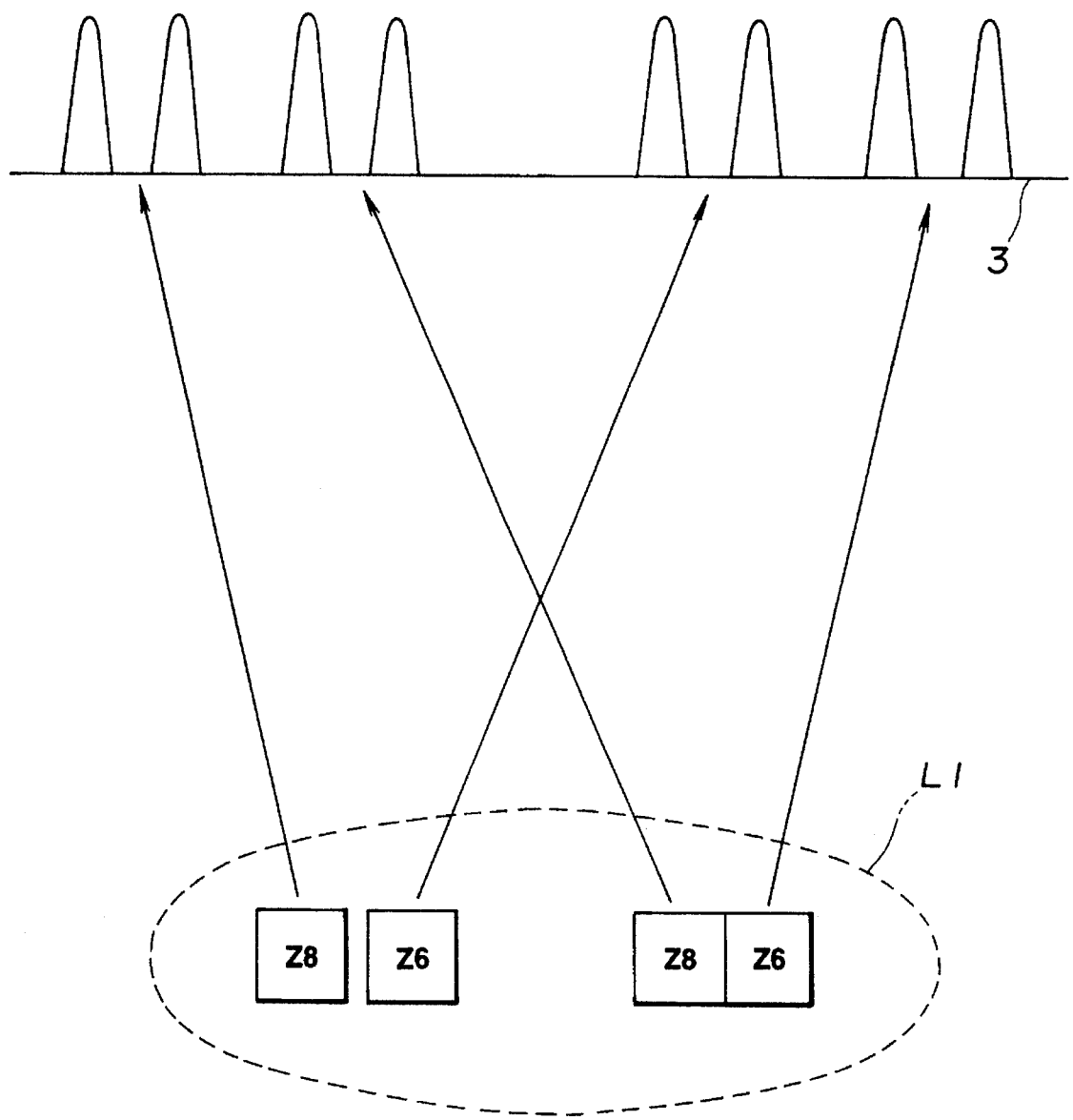
FIG. 13 is a schematic diagram illustrating the relationship between marks and the sensor in the present embodiment.

In the present embodiment, when projecting the light beam L1 onto the marks 1 and 2 for measuring misalignment in the case of FIGS. 10(A) through 10(D), the light beam L1 may be separately projected by moving the optical pickup head 10. If a configuration as shown in FIG. 13 is adopted, the optical pickup head 10 need not be moved. Thus, the problem of M/P deviation does not arise.

In FIG. 2, the marks Z1 and Z4 function as convex lenses, and the marks Z2 and Z3 function as concave lenses. The present embodiment is effective whether the combination of the marks Z5 and Z6, or the combination of the marks Z7 and Z8 shown in FIGS. 6–9 corresponds to the combination of the marks Z1 and Z2, or the combination of the marks Z3 and Z4.

In the present invention, as can be understood from FIG. 10(D), if entirely the same marks are used as marks for position detection and marks for measuring misalignment, the combination of the marks Z6 and Z8 having a value 0 of the amount of misalignment W (mark 2 for measuring misalignment) becomes unnecessary because it can be replaced by marks for position detection. Hence, the configuration and procedure of marks as shown in FIG. 14 are provided. FIG. 14 illustrates a procedure of replacing the amount of misalignment W between a mask and a wafer by the amount of deviation W between marks in the same manner as in the case of FIG. 10.

In FIG. 14(A), the first mask has a mark for measuring alignment, Z4, and a mark for position detection, Z2 and Z4, while the wafer has a mark for measuring alignment, Z4, and a mark for position detection, Z2 and Z4. In FIG. 14(B), the second mask has a mark for measuring misalignment Z2, which is offset from mark Z4 for measuring alignment on the wafer by the misalignment distance W. In addition, the second mask includes marks Z1 and Z3 for position detection and the wafer includes marks Z2 and Z4 for position detection, which are also offset from the marks for position detection of the second mask by misalignment distance W. FIG. 14(C) shows the case in which the second mask has a mark Z1 for measuring misalignment while the wafer has marks Z2 and Z4 for measuring misalignment, wherein marks Z2 and Z4 are separated from each other by the misalignment distance W. In addition, in this embodiment, the second mask comprises marks Z1 and Z3 for position detection, while the wafer includes marks Z2 and Z4 for position detection. In FIG. 14(D), an embodiment is shown in which a third mask includes marks Z1 and Z3 for measuring misalignment, while the wafer has marks Z2 and Z4 for measuring misalignment. The marks Z2 and Z4 are separated from each other by the misalignment distance W, while the marks Z1 and Z3 of the third mask exhibit a deviation X between the boundary of marks Z1 and Z3 and the boundary of marks Z2 and Z4 on the wafer. In addition, in this embodiment the third mask includes marks Z1 and Z3 for position detection, while the wafer includes marks Z2 and Z4 for position detection. These marks for position detection on the third mask and the wafer are also misaligned by distance X.

The individual components shown in outline or designated by blocks in the drawings are all well known in the position detection method arts and their specific construction and operation are not critical to the operation or best mode for carrying out the invention.

The invention may be embodied in other specific forms without departing from the spirit and essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method for measuring the interval between a first mark and a second mark on a first object, said method comprising the steps of:

providing a third mark, having the same optical function as the first mark, and a fourth mark, having the same optical function as the second mark, on the first object with a predetermined interval therebetween;

providing a fifth mark, and a sixth mark, on a second object;

projecting light onto the first and second objects;

projecting a first light beam passing through the fifth mark and reflected by the first mark onto a predetermined detection surface, and projecting a second light beam passing through the sixth mark and reflected by the second mark onto the predetermined detection surface;

projecting a third light beam passing through the fifth mark and reflected by the third mark onto the predetermined detection surface, and projecting a fourth light beam passing through the sixth mark and reflected by the fourth mark onto the predetermined detection surface; and determining the relationship between the actual interval between the first and second marks and information relating to the incident positions of the first and second light beams on the predetermined detection surface, based on the predetermined interval and information relating to the incident positions of the third and fourth light beams on the predetermined detection surface.

2. A method according to claim 1, wherein each of the marks comprises a physical optical element.

3. A method according to claim 2, wherein the incident positions of the first, second, third and fourth light beams on the predetermined detection surface differ from each other.

4. A method for measuring an interval between a pair of marks on a first object, said method comprising the steps of:

providing a plurality of the pair of marks on the first object, each of the plurality of the pair of marks having a different predetermined interval from each other;

detecting the interval between each of the plurality of the pair of marks with a single position detection apparatus; and determining the relationship between the actual interval between a pair of marks on the first object and a result of the detection of the position detection apparatus, based on the predetermined intervals and the results of said detecting step.

5. A method according to claim 4, further comprising the steps of:

providing a first mark and a second mark, on a second object opposed the first object;

projecting a light onto the first and second objects;

projecting a first light beam passing the first mark and reflected by one mark of each of the plurality of pair of marks onto a predetermined detection surface, and projecting a second light beam passing the second mark and reflected by another mark of each of the plurality of pair of marks onto the predetermined detection surface; and detecting an incident position of the first and second light beams on the predetermined detection surface.

* * * * *

UNITED STATES PATENT AND TRADEMARK OFFICE
CERTIFICATE OF CORRECTION

PATENT NO. : 5,557,411
DATED : September 17, 1996
INVENTOR(S) : SAKAE HOURYU, ET AL.

It is certified that error appears in the above-indentified patent and that said Letters Patent is hereby corrected as shown below:

COLUMN 9

Line 3, "is" should read --are--. (1st occurrence)
  Line 12, "as, indicated" should read --as indicated--.

COLUMN 14

Line 12, "opposed" should read --opposing--.
  Line 15, "pair" should read --the pair--.
  Line 19, "pair" should read --the pair--.

Signed and Sealed this

First Day of April, 1997

Attest:

BRUCE LEHMAN

Attesting Officer  Commissioner of Patents and Trademarks